United States Patent
Deng et al.

(10) Patent No.: US 10,340,878 B2
(45) Date of Patent: Jul. 2, 2019

(54) CARRIER AGGREGATION CIRCUIT ALLOWING CARRIER WAVES WITH DIFFERENT FREQUENCIES TO SHARE THE SAME AMPLIFIER

(71) Applicant: RichWave Technology Corp., Taipei (TW)

(72) Inventors: Wei-Kung Deng, Taipei (TW); Chih-Min Chiang, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/949,024

(22) Filed: Apr. 9, 2018

(65) Prior Publication Data
US 2019/0149118 A1  May 16, 2019

(30) Foreign Application Priority Data
Nov. 14, 2017  (TW) .............................. 106139297 A (51) Int. Cl.
*H03H 7/38* (2006.01)
*H03F 3/19* (2006.01)
*H01P 5/12* (2006.01)

(52) U.S. Cl.
CPC ................ *H03H 7/38* (2013.01); *H01P 5/12* (2013.01); *H03F 3/19* (2013.01); *H03F 2200/165* (2013.01); *H03F 2200/222* (2013.01); *H03F 2200/294* (2013.01); *H03F 2200/451* (2013.01)

(58) Field of Classification Search
CPC ..... H03H 7/38; H01P 5/12; H03F 3/19; H03F 2200/294; H03F 2200/165; H03F 2200/451; H03F 2200/222
See application file for complete search history.

(56) References Cited

U.S. PATENT DOCUMENTS

| 2016/0065255 A1 | 3/2016 | Domino |
| 2016/0126993 A1 | 5/2016 | Wloczysiak |
| 2017/0302236 A1* | 10/2017 | Oshita ..................... H03F 3/195 |
| 2018/0337706 A1* | 11/2018 | Yamazaki ................ H04B 1/40 |

FOREIGN PATENT DOCUMENTS

| CN | 105119611 A | 12/2015 |
| WO | 2016/151338 A1 | 9/2016 |

* cited by examiner

*Primary Examiner* — Jung Kim
(74) *Attorney, Agent, or Firm* — Winston Hsu (57) ABSTRACT

A carrier aggregation circuit includes a signal input terminal, a signal output terminal, a first filter, a first output transform circuit, a second filter, and a second output transform circuit. The signal input terminal receives a radio frequency signal with carrier waves with first and second carrier wave frequencies. The first filter and the second filter are coupled between the signal input terminal and the signal output terminal respectively, and can respectively filter out signals with frequencies other than the first and the second carrier wave frequencies. The first output transform circuit is coupled between the first filter and the signal output terminal, and has an output impedance equivalent to an open circuit at the second carrier frequency. The second output transform circuit is coupled between the second filter and the signal output terminal, and has an output impedance equivalent to an open circuit at the first carrier frequency.

20 Claims, 7 Drawing Sheets

CARRIER AGGREGATION CIRCUIT ALLOWING CARRIER WAVES WITH DIFFERENT FREQUENCIES TO SHARE THE SAME AMPLIFIER

CROSS REFERENCE TO RELATED APPLICATION

This application claims priority of Taiwan application No. 106139297, which was filed on Nov. 14, 2017, and is included herein by reference.

TECHNICAL FIELD

This invention is related to a carrier aggregation circuit, and more particularly, to a carrier aggregation circuit allowing carrier waves with different frequencies to share the same amplifier.

BACKGROUND

As users demand for more and more network resources, Long Term Evolution Advanced (LTE-Advanced) has proposed the carrier aggregation (CA) technology to deal with the lack of network bandwidth. The idea of carrier aggregation is mainly to integrate the bandwidths of several separated bands, so the data transmission can be more efficient, and the communication speed in the network can be improved.

In prior art, to derive signals in a desired band, the carrier aggregation circuit would adopt a filter having the corresponding band to derive the corresponding signals. In addition, since the impedances on the paths of different filters are different, the carrier aggregation circuit can amplify signals of different bands with different amplifiers for avoiding the loading effects on a transmission path from interfering with the transmissions on other transmission paths. Consequently, the design and the use of carrier aggregation circuit would be rather limited. For example, if the communications device needs to support carrier aggregation for different bands, then the previous carrier aggregation circuit has to be replaced, and a new carrier aggregation circuit would be designed according to the new requirement. Furthermore, since the opened communication bands are different in different countries, it becomes inevitable to face the challenges on designing and manufacturing the carrier aggregation circuits.

SUMMARY

One embodiment of the present invention discloses a carrier aggregation circuit. The carrier aggregation circuit includes a signal input terminal, a signal output terminal, a first filter, a first output transform circuit, a second filter, and a second output transform circuit.

The signal input terminal receives a radio frequency signal having a first carrier wave with a first carrier wave frequency and a second carrier wave with a second carrier wave frequency.

The first filter is coupled between the signal input terminal and the signal output terminal, and filters out signals with frequencies other than the first carrier wave frequency. The first filter has an input terminal and an output terminal. The first output transform circuit is coupled between the output terminal of the first filter and the signal output terminal, and has an output impedance effectively equivalent to an open circuit at the second carrier wave frequency.

The second filter is coupled between the signal input terminal and the signal output terminal, and filters out signals with frequencies other than the second carrier wave frequency. The second filter has an input terminal and an output terminal. The second output transform circuit is coupled between the output terminal of the second filter and the signal output terminal, and has an output impedance effectively equivalent to an open circuit at the first carrier wave frequency.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
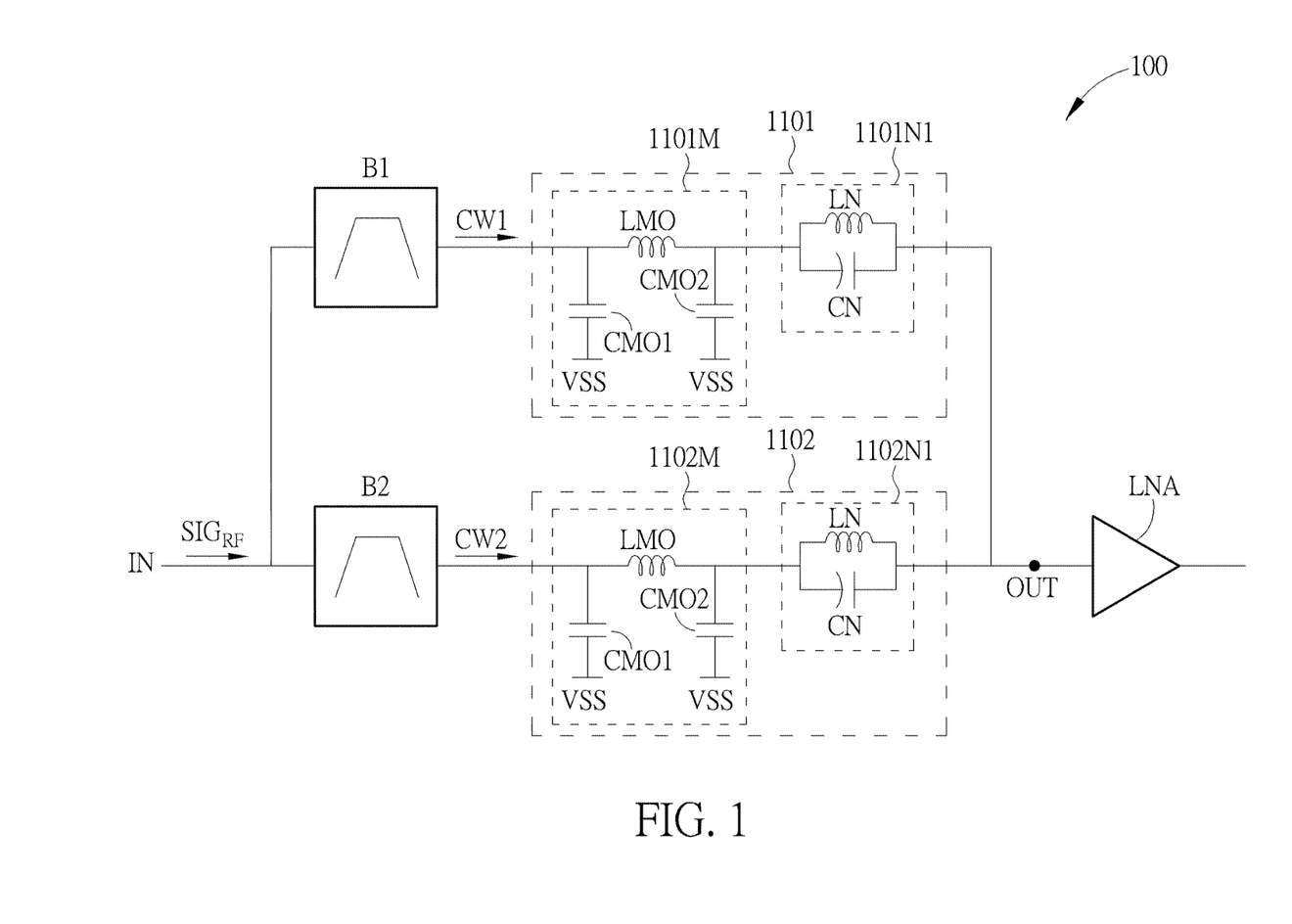
FIG. 1 shows a carrier aggregation circuit according to one embodiment of the present invention.

FIG. 1 shows a carrier aggregation (CA) circuit 100 according to one embodiment of the present invention. The carrier aggregation circuit 100 includes a signal input terminal IN, a signal output terminal OUT, a first filter B1, a second filter B2, a first output transform circuit 1101, and a second output transform circuit 1102.

In the embodiment of FIG. 1, the carrier aggregation circuit 100 can be applied to a receiver of a mobile communications system; therefore, the signal input terminal IN can receive a radio frequency signal $SIG_{RF}$. The radio frequency signal $SIG_{RF}$ can include a first carrier wave CW1 with a first carrier wave frequency and a second carrier wave CW2 with a second carrier wave frequency.

The first filter B1 can be coupled between the signal input terminal IN and the signal output terminal OUT, and can filter out the signals with frequencies other than the first carrier wave frequency. That is, with the first filter B1, the first carrier wave CW1 in the radio frequency signal $SIG_{RF}$ can be derived while other carrier waves in the radio frequency signal $SIG_{RF}$ are filtered out.

Similarly, the second filter B2 can be coupled between the signal input terminal IN and the signal output terminal OUT, and can filter out the signals with frequencies other than the second carrier wave frequency. That is, with the second filter B2, the second carrier wave CW2 in the radio frequency signal $SIG_{RF}$ can be derived while other carrier waves in the radio frequency signal $SIG_{RF}$ are filtered out. In some embodiments of the present invention, the first filter B1 and the second filter B2 can be, for example, implemented by surface acoustic wave filters (SAW filters).

The first output transform circuit 1101 can be coupled between the output terminal of the first filter B1 and the signal output terminal OUT. To prevent signals with the second carrier wave frequency from injecting from the signal output terminal OUT to the output terminal of the first filter B1, causing loading effects and lowering the communication quality, the carrier aggregation circuit 100 can adjust the output impedance of the first output transform circuit 1101 to avoid the loading effects. In other words, the first output transform circuit 1101 of the carrier aggregation circuit 100 can be designed according to the output reflection coefficient (S22) of the first filter B1, so the output impedance of the first output transform circuit 1101 is effectively equivalent to an open circuit at the second carrier wave frequency. Consequently, the injection of the second carrier wave with the second carrier wave frequency to the first filter B1 would be reduced.

Similarly, the second output transform circuit 1102 can be coupled between the output terminal of the second filter B2 and the signal output terminal OUT, and the output impedance of the second output transform circuit 1102 is effectively equivalent to an open circuit at the first carrier wave frequency. In other words, once the first carrier wave CW1 passes through the first filter B1, it would be difficult for the first carrier wave CW1 to transmit from the signal output terminal OUT back to the second filter B2. Therefore, the loading effect can be reduced, and the signal quality can be improved.

In addition, the phrase "effectively equivalent to an open circuit" aforementioned is not limited to a totally open circuit, but also includes relatively open circuits. For example, if the matched impedance corresponding to the second carrier wave frequency is 50 ohms, then the output impedance of the first output transform circuit 1101 would be deemed as effectively equivalent to an open circuit when the output impedance of the first output transform circuit 1101 corresponding to the second carrier wave frequency is much greater than 50 ohms, for example, 250 ohms.

In addition, to ensure the first carrier wave CW1 can pass through the first filter B1 and be outputted to the signal output terminal OUT smoothly, the input impedance of the first output transform circuit 1101 can be designed to match with the frequency of the first carrier wave CW1. Also, the input impedance of the second output transform circuit 1102 can match with the frequency of the second carrier wave CW2.

Since the carrier aggregation circuit 100 can reduce the loading effect by using the first output transform circuit 1101 and the second output transform circuit 1102, the signal output terminal OUT can be coupled to the amplifier LNA as shown in the embodiment of FIG. 1. That is, the first carrier wave CW1 passing through the first filter B1 and the second carrier wave CW2 passing through the second filter B2 can be amplified and processed by the same amplifier LNA. Consequently, the number of amplifiers can be reduced, and so as the chip area. Meanwhile, the design and the use of the carrier aggregation circuit 100 would be more flexible.

In FIG. 1, the first output transform circuit 1101 can include an output impedance transform unit 1101N1. The output impedance transform unit 1101N1 can adjust the output impedance of the first output transform circuit 1101 corresponding to the second carrier wave frequency so the overall output impedance of the first output transform circuit 1101 corresponding to the second carrier wave frequency can be effectively equivalent to an open circuit. Similarly, the second output transform circuit 1102 can include an output impedance transform unit 1102N1. The output impedance transform unit 1101N2 can adjust the output impedance of the second output transform circuit 1102 corresponding to the first carrier wave frequency so the overall output impedance of the second output transform circuit 1102 corresponding to the first carrier wave frequency can be effectively equivalent to an open circuit.

Taking the output impedance transform unit 1101N1 for example, the output impedance transform unit 1101N1 can be a parallel resonator, that is, the first output impedance transform unit 1101N1 can include an inductor LN and a capacitor CN coupled in parallel. However, the present invention is not limited to implementing the output impedance transform unit 1101N1 with a parallel resonator. In some embodiments of the present invention, if the condition of the impedance of the first filter B1 permits, the output impedance transform unit 1101N1 can be implemented by a transmission line due to its capability of rotating phases.

In addition, the first output transform circuit 1101 can further include an output match transform unit 1101M. The output match transform unit 1101M can adjust the input impedance of the first output transform circuit 1101 to match with the first carrier wave frequency. Similarly, the second output transform circuit 1102 can include an output match transform unit 1102M. The output match transform unit 1102M can adjust the input impedance of the second output transform circuit 1102 to match with the second carrier wave frequency.

Taking the output match transform unit 1101M as an example, in FIG. 1, the output match transform unit 1101M can include an inductor LMO, a capacitor CMO1, and a capacitor CMO2. The inductor LMO can be coupled between the output terminal of the first filter B1 and the signal output terminal OUT, namely, the inductor LMO can be coupled between the output terminal of the first filter B1 and the output impedance transform unit 1101N1. The capacitor CMO1 can be coupled between the first terminal of the inductor LMO and a reference voltage VSS, and the capacitor CMO2 can be coupled between the second terminal of the inductor LMO and the reference voltage VSS. By selecting the capacitance and the inductance properly, the output match transform unit 1101M can be designed with required impedance, ensuring the impedance of the first output transform circuit 1101 to be matched with the first carrier wave CW1 and allowing the first carrier wave CW1 to be outputted to the signal output terminal OUT smoothly. In some embodiments, the reference voltage VSS could be ground voltage (GND) or common voltage.

Figure 2:
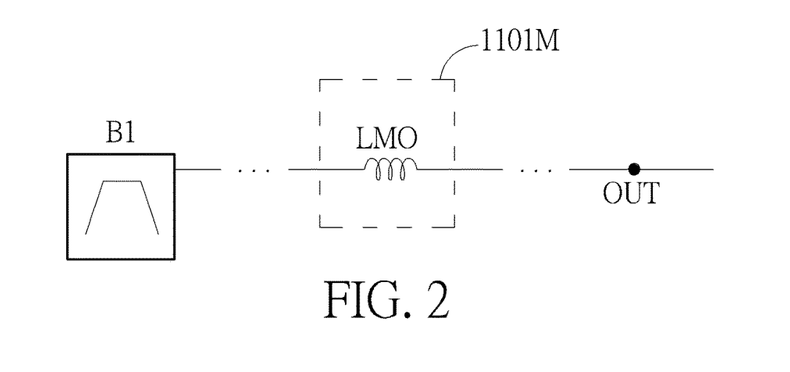
FIGS. 2 to 4 show output match transform units in FIG. 1 according to different embodiments of the present invention.
Figure 3:
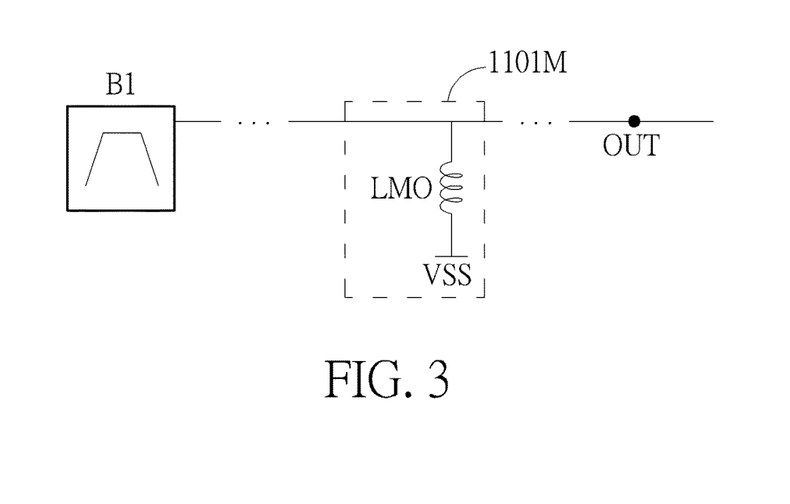
Figure 4:
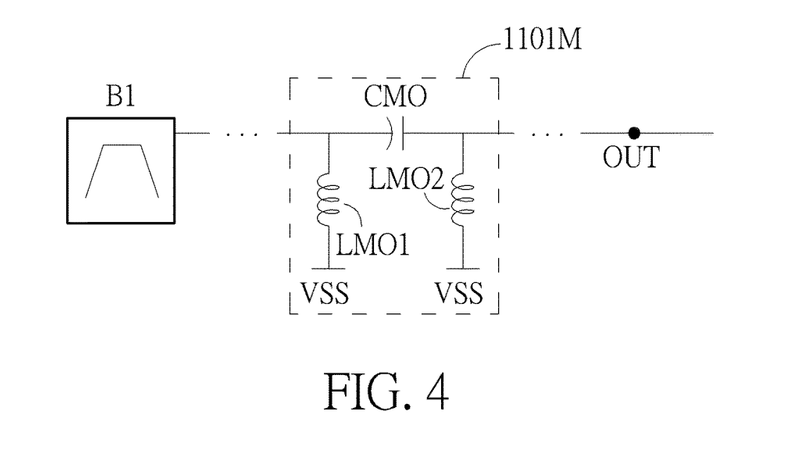

In some embodiments, the designer may use other circuits to implement the output match transform unit 1101M. FIGS. 2 to 4 show the output match transform unit 1101M according to other different embodiments of the present invention.

In FIG. 2, the output match transform unit 1101M can include an inductor LMO, and the inductor LMO can be coupled between the output terminal of the first filter B1 and the signal output terminal OUT without using capacitors.

In FIG. 3, the output match transform unit 1101M can include an inductor LMO, and the inductor LMO has a first terminal and a second terminal. The first terminal of the inductor LMO is coupled between the output terminal of the first filter B1 and the signal output terminal OUT, and the second terminal of the inductor LMO is coupled to the reference voltage VSS.

In FIG. 4, the output match transform unit 1101M can include a capacitor CMO, and inductors LMO1 and LMO2. The capacitor CMO can be coupled between the output terminal of the first filter B1 and the signal output terminal OUT. The inductor LMO1 can be coupled between the first terminal of the capacitor CMO and the reference voltage VSS, and the inductor LMO2 can be coupled between the second terminal of the capacitor CMO and the reference voltage VSS.

In addition, in some embodiments of the present invention, when the impedance is substantially matched, the output match transform unit 1101M can be deemed as a short circuited path.

In FIG. 1, the output match transform unit 1101M is coupled to the output terminal of the first filter B1, and the output impedance transform unit 1101N1 is coupled between the output match transform unit 1101M and the signal output terminal OUT. However, the present invention is not limited to this order. In other embodiments, the output impedance transform unit 1101N1 can also be coupled to the output terminal of the first filter B1, and the output match transform unit 1101M can be coupled between the output impedance transform unit 1101N1 and the signal output terminal OUT.

Figure 5:
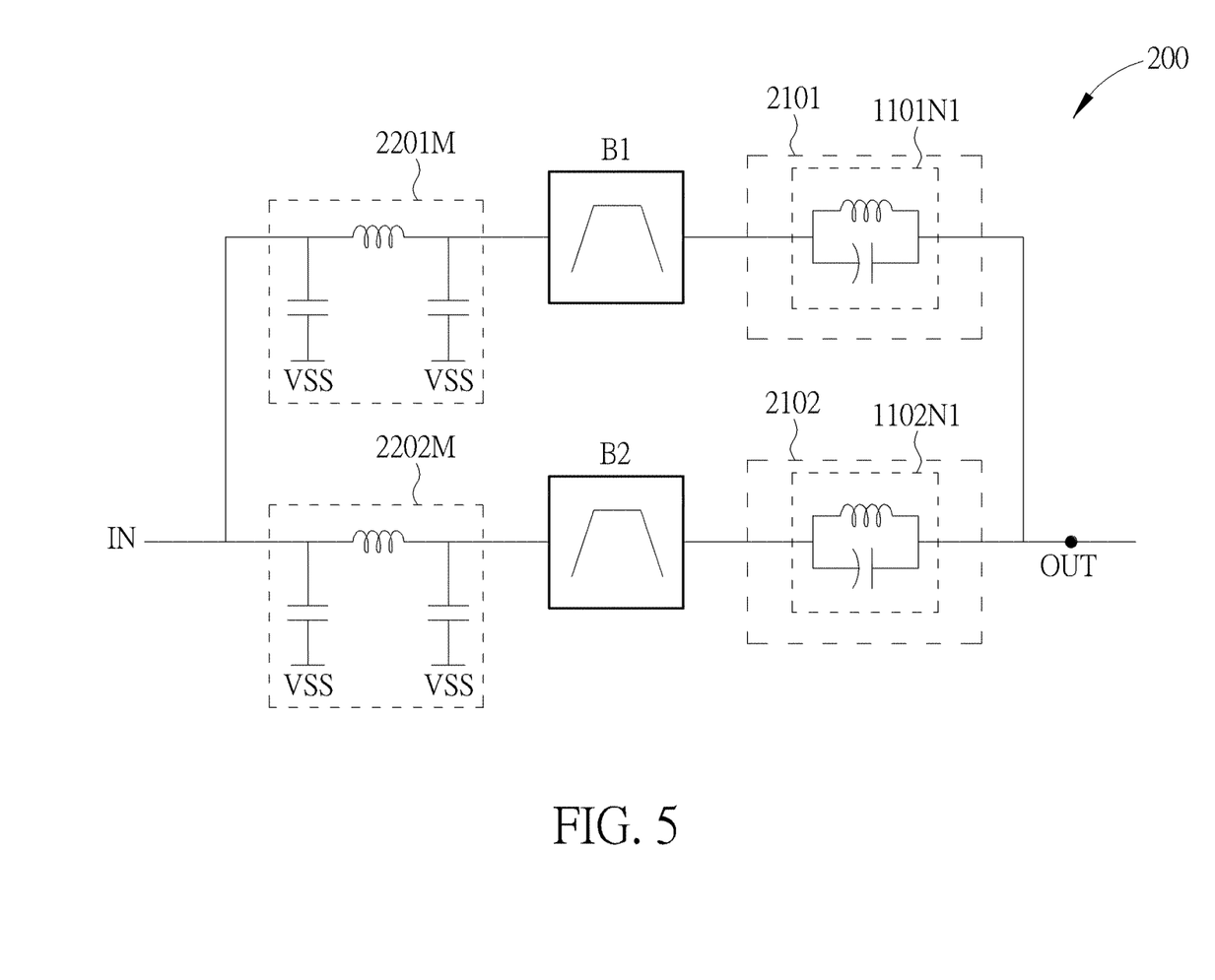
FIGS. 5-9 show carrier aggregation circuits according to different embodiments of the present invention.

Furthermore, although in FIG. 1, the output match transform unit 1101M is disposed between the output terminal of the first filter B1 and the signal output terminal OUT, in some other embodiments of the present invention, the output match transform unit 1101M can also be disposed between the first filter B1 and the signal input terminal IN. FIG. 5 shows a carrier aggregation circuit 200 according to another embodiment of the present invention.

The difference between the carrier aggregation circuit 200 and the carrier aggregation circuit 100 is in that the first output transform circuit 2101 and the second output transform circuit 2102 do not include output match transform circuits. However, the carrier aggregation circuit 200 further includes input match transform units 2201M and 2202M. The input match transform unit 2201M can be coupled between the signal input terminal IN and the first filter B1, and can match the input impedance of the first filter B1 and the first input transform circuit 2101 with the first carrier wave frequency. The input match transform unit 2202M can be coupled between the signal input terminal IN and the second filter B2, and can match the input impedance of the second filter B2 and the second input transform circuit 2102 with the second carrier wave frequency. In addition, the input match transform units 2201M and the 2202M can be implemented in a similar manner as the output match transform unit 1101M. Therefore, the similar structures shown in FIGS. 1 to 4 can be referenced and will not be further repeated herein.

Figure 6:
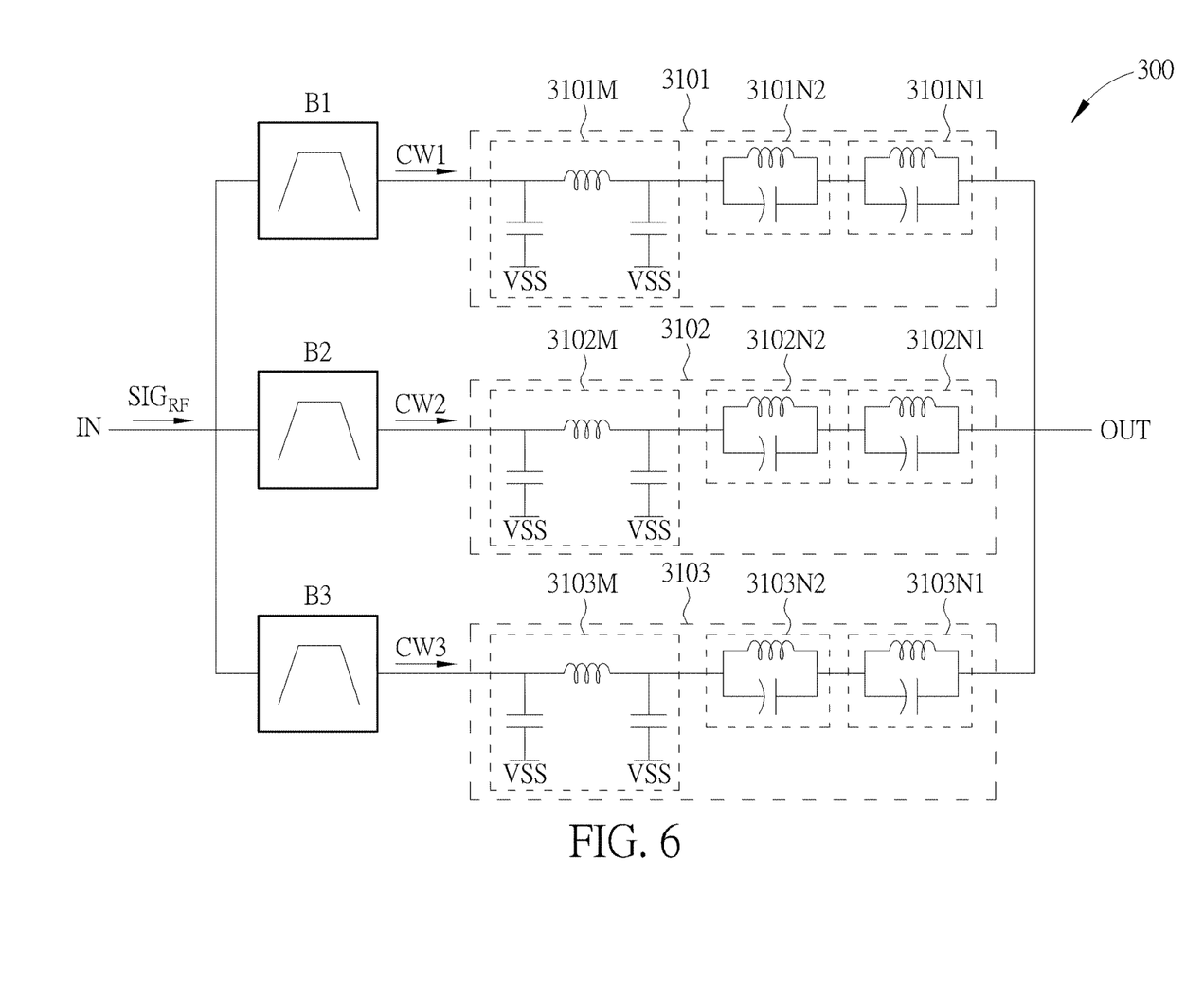

FIG. 6 shows a carrier aggregation circuit 300 according to one embodiment of the present invention. The carrier aggregation circuits 100 and 300 have similar structures and can be operated with similar principles; however, the carrier aggregation circuit 300 can support aggregation signals with three carrier waves. In other words, the radio frequency signal $SIG_{RF}$ received by the carrier aggregation circuit 300 can further include a third carrier wave CW3 with a third carrier wave frequency. In addition, the carrier aggregation circuit 300 can further include the third filter B3 and the third output transform circuit 3103.

The third filter B3 can be coupled between the signal input terminal IN and the signal output terminal OUT, and can filter out signals with frequencies other than the third carrier wave frequency. That is, with the third filter B3, the third carrier wave CW3 in the radio frequency signal $SIG_{RF}$ can be derived, and the first carrier wave CW1 and the second carrier wave CW2 can be filtered out.

The third output transform circuit 3103 is coupled between the output terminal of the third filter B3 and the signal output terminal OUT. The output impedance of the third output transform circuit 3103 is effectively equivalent to an open circuit at the first carrier wave frequency and at the second carrier wave frequency. In other words, by adjusting the output impedance of the third output transform circuit 3103, the carrier aggregation circuit 300 can reduce the cases that the first carrier wave CW1 and the second carrier wave CW2 transmit back to the third filter B3, preventing the loading effects from lowering the signal quality. In addition, the input impedance of the third output transform circuit 3103 can be designed to match with the third carrier wave frequency so that the third carrier wave CW3 can be outputted to the signal output terminal OUT smoothly.

For example, the third output transform circuit 3103 can include an output impedance transform unit 3103N1, 3103N2, and the input match transform unit 3103M. The output impedance transform unit 3103N1 can adjust the output impedance of the third output transform circuit 3103 corresponding to the first carrier wave frequency so that the overall output impedance of the third output transform circuit 3103 is effectively equivalent to an open circuit at the first carrier wave frequency. The output impedance transform unit 3103N2 can adjust the output impedance of the third output transform circuit 3103 corresponding to the second carrier wave frequency so that the overall output impedance of the third output transform circuit 3103 is effectively equivalent to an open circuit at the second carrier wave frequency. The input match transform unit 3103M can match the input impedance of the third output transform circuit 3103 with the third carrier wave frequency.

Similarly, in FIG. 6, the output impedance of the first output transform circuit 3101 and the output impedance of the second output transform circuit 3102 are effectively equivalent to open circuits at the third carrier wave frequency. Consequently, the third carrier wave CW3 can be prevented from transmitting back to the first filter B1 and the second filter B2 after being outputted from the signal output terminal OUT, preventing the loading effect from lowering the signal quality.

For example, the first output transform circuit 3101 can include output impedance transform units 3101N1 and 3101N2 for making the output impedance of the first output transform circuit 3101 effectively equivalent to an open circuit at the second carrier wave frequency and the third carrier wave frequency. Also, the first output transform circuit 3101 can further include an input match transform unit 3101M for making the input impedance of the first output transform circuit 3101 matched with the first carrier wave frequency. The second output transform circuit 3102 can include output impedance transform units 3102N1 and 3102N2 for making the output impedance of the second output transform circuit 3102 effectively equivalent to an open circuit at the first carrier wave frequency and the third carrier wave frequency. Also, the second output transform circuit 3102 can further include an input match transform unit 3102M for making the input impedance of the second output transform circuit 3102 matched with the second carrier wave frequency.

In some embodiments, the output impedance transform units 3101N1, 3101N2, 3102N1, 3102N2, 3103N1, and 3103N2, and the input match transform units 3101M, 3102M and 3103M can be implemented by referencing the aforementioned output impedance transform unit 1101N1 and the output match transform unit 1101M while the capacitance and inductance should be selected properly according to the requirements of the corresponding carrier wave frequencies and the filters.

In some embodiments of the present invention, since the carrier aggregation circuit 300 can adjust the impedance corresponding to different carrier waves through the first output transform circuit 3101, the second output transform circuit 3102, and the third output transform circuit 3103, the carrier aggregation circuit 300 can not only support radio frequency signals aggregating the three carrier waves CW1, CW2, and CW3, but also support radio frequency signals aggregating any two of the three carrier waves CW1, CW2, and CW3. However, in some embodiments, the aggregation circuit 300 can further include switch circuits to prevent the additional signal path from affecting other carrier waves.

Figure 7:
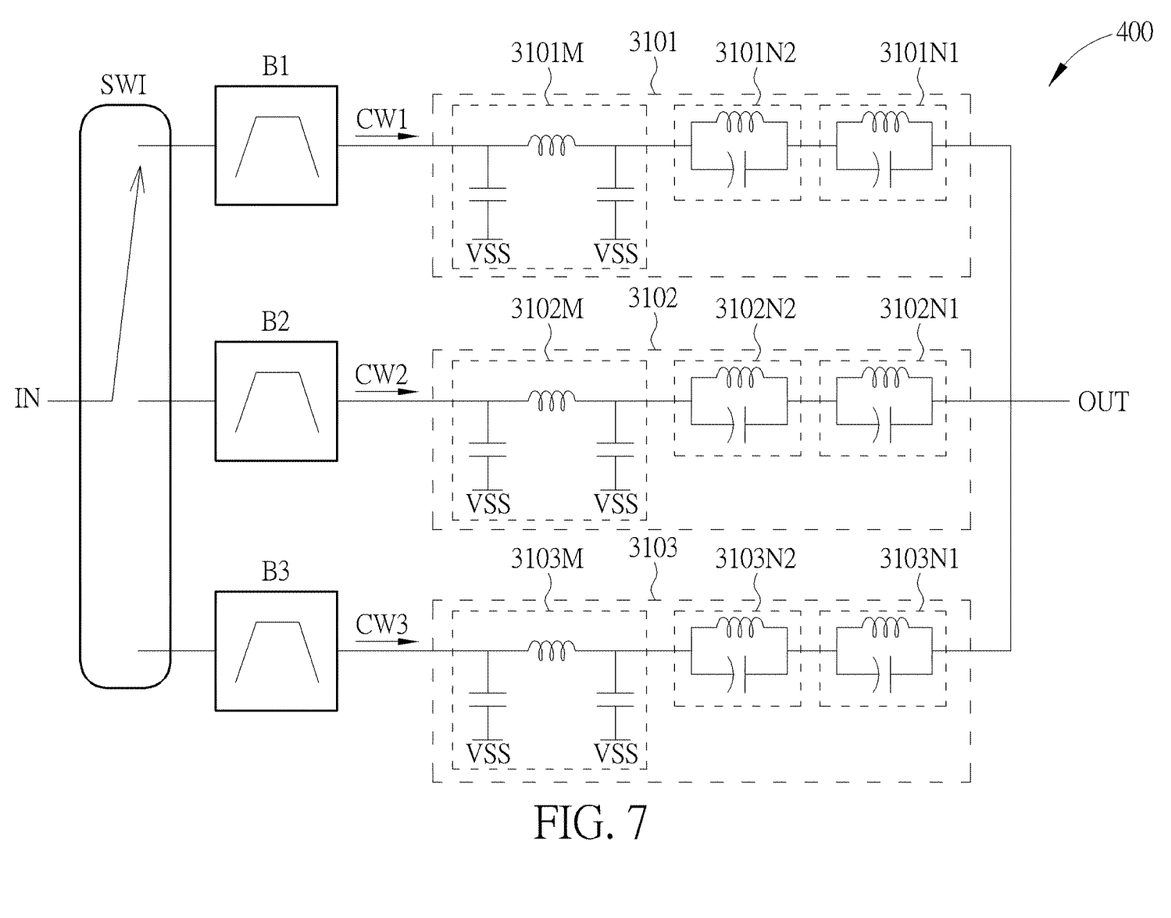

FIG. 7 shows a carrier aggregation circuit 400 according to one embodiment of the present invention. The carrier aggregation circuits 300 and 400 have similar structures and operation principles; however, the main difference between these two is in that the carrier aggregation circuit 400 further includes a first switch circuit SWI.

The first switch circuit SWI can selectively couple the signal input terminal IN with at least two of the first filter B1, the second filter B2, and the third filter B3.

In other words, the carrier aggregation circuit 400 can choose the aggregation mode with the first switch circuit SWI. For example, if the radio frequency signal $SIG_{RF}$ includes three carrier waves CW1, CW2, and CW3, then the first switch circuit SWI can electrically couple the signal input terminal IN to the first filter B1, the second filter B2, and the third filter B3 at the same time. However, if the radio frequency signal $SIG_{RF}$ includes only the two carrier waves CW2 and CW3, then the first switch circuit SWI would electrically couple the signal input terminal IN to the second filter B2 and the third filter B3.

In another embodiment of the present invention, the first switch circuit SWI can selectively couple the signal input terminal IN to at least one of the first filter B1, the second filter B2, and the third filter B3.

Consequently, when designing the carrier aggregation circuit 400, the space for containing the circuits to support the three carrier waves can be preserved during the layout phase, and the elements can be decided according to the practical requirements later. Therefore, the effort for redesigning the circuit layout to meet different requirements can be saved, leaving more flexibility on the circuit design.

Figure 8:
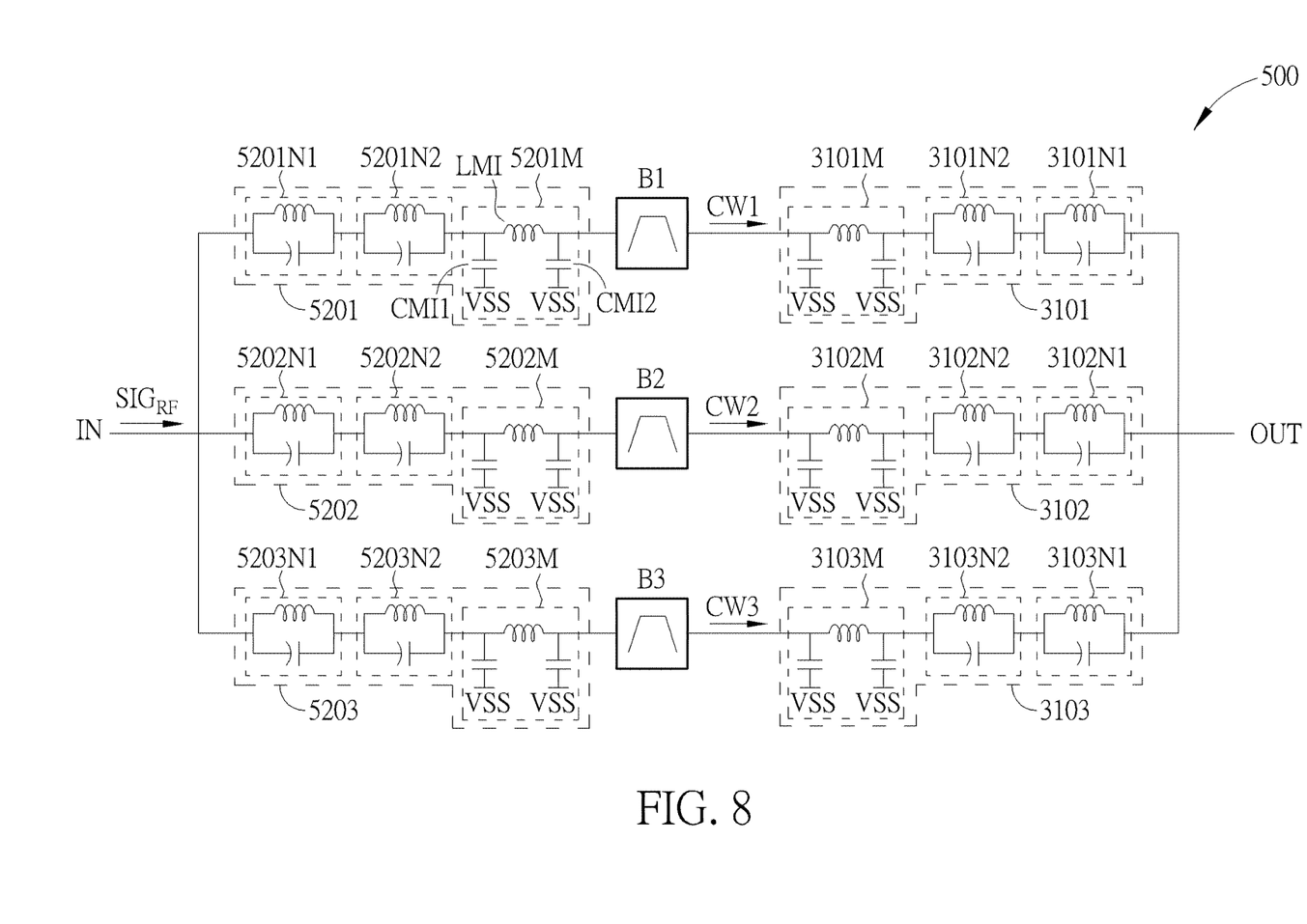

FIG. 8 shows a carrier aggregation circuit 500 according to one embodiment of the present invention. The carrier aggregation circuits 500 and 300 have similar structures and operation principles; however, the main difference between these two is in that the carrier aggregation circuit 500 can include a first input transform circuit 5201, a second input transform circuit 5202, and a third input transform circuit 5203.

The first input transform circuit 5201 is coupled between the input terminal of the first filter B1 and the signal input terminal IN. The input impedance of the first input transform circuit 5201 is effectively equivalent to an open circuit at the second carrier wave frequency and at the third carrier wave frequency.

The second input transform circuit 5202 can be coupled between the input terminal of the second filter B2 and the signal input terminal IN. The input impedance of the second input transform circuit 5202 is effectively equivalent to an open circuit at the first carrier wave frequency and at the third carrier wave frequency.

The third input transform circuit 5203 can be coupled between the input terminal of the third filter B3 and the signal input terminal IN. The input impedance of the third input transform circuit 5203 is effectively equivalent to an open circuit at the first carrier wave frequency and at the second carrier wave frequency.

The first input transform circuit 5201, the second input transform circuit 5202, and the third input transform circuit 5203 can be implemented with similar principles. Taking the first input transform circuit 5201 as an example, in FIG. 8, the first input transform circuit 5201 can include the input impedance transform units 5201N1 and 5201N2, and an input match transform unit 5201M.

The input impedance transform unit 5201N1 can adjust the input impedance of the first input transform circuit 5201 corresponding to the second carrier wave frequency, and the second input impedance transform unit 5201N2 can adjust the input impedance of the first input transform circuit 5201 corresponding to the third carrier wave frequency. Also, the input match transform unit 5201M can match the impedance of the first input transform circuit 5201 with the first carrier wave frequency.

The input impedance transform units 5201N1 and 5201N2 can be similar to the output impedance transform unit 1101N1. That is, the input impedance transform units 5201N1 and 5201N2 can be parallel resonators, and can be implemented by capacitors and inductors coupled in parallel. In addition, if the condition of the impedance permits, the input impedance transform units 5201N1 and 5201N2 can also be implemented by transmission lines due to their intrinsic capability of rotating phases.

In FIG. 8, the input match transform unit 5201M and the output match transform unit 1101M can be implemented by similar principles. That is, the input match transform unit 5201M can include an inductor LMI, and capacitors CMI1 and CMI2. The inductor LMI can be coupled between the input terminal of the first filter B1 and the signal input terminal IN. The capacitor CMI1 can be coupled between the first terminal of the inductor LMI and the reference voltage VSS, and the capacitor CMI2 can be coupled between the second terminal of the inductor LMI and the reference voltage VSS.

In some embodiments, the input match transform unit 5201M can be implemented by referencing the output match transform unit 1101M shown in FIGS. 2 to 4 while the input match transform unit 5201M would be coupled between the input terminal of the first filter B1 and the signal input terminal IN. Also, if the condition of the impedance permits, the input match transform unit 5201M can also be implemented by a short circuited path.

In addition, in FIG. 8, the input impedance transform unit 5201N1 and the input impedance transform unit 5201N2 can be coupled to the signal input terminal IN, and the input match transform unit 5201M can be coupled between the input impedance transform unit 5201N2 and the input terminal of the first filter B1. However, the present invention is not limited to the aforementioned order. In some other embodiments, the input match transform unit 5201M, the input impedance transform unit 5201N1 and the input impedance transform unit 5201N2 can be coupled between the input terminal of the first filter B1 and the signal input terminal IN in any other orders.

The carrier aggregation circuit 500 not only includes the output transform circuits 3101, 3102, and 3103, but also includes the input transform circuits 5201, 5202, and 5203. Therefore, comparing to the carrier aggregation circuit 300, the carrier aggregation circuit 500 can further reduce the loading effect, and improve the output signal quality.

Figure 9:
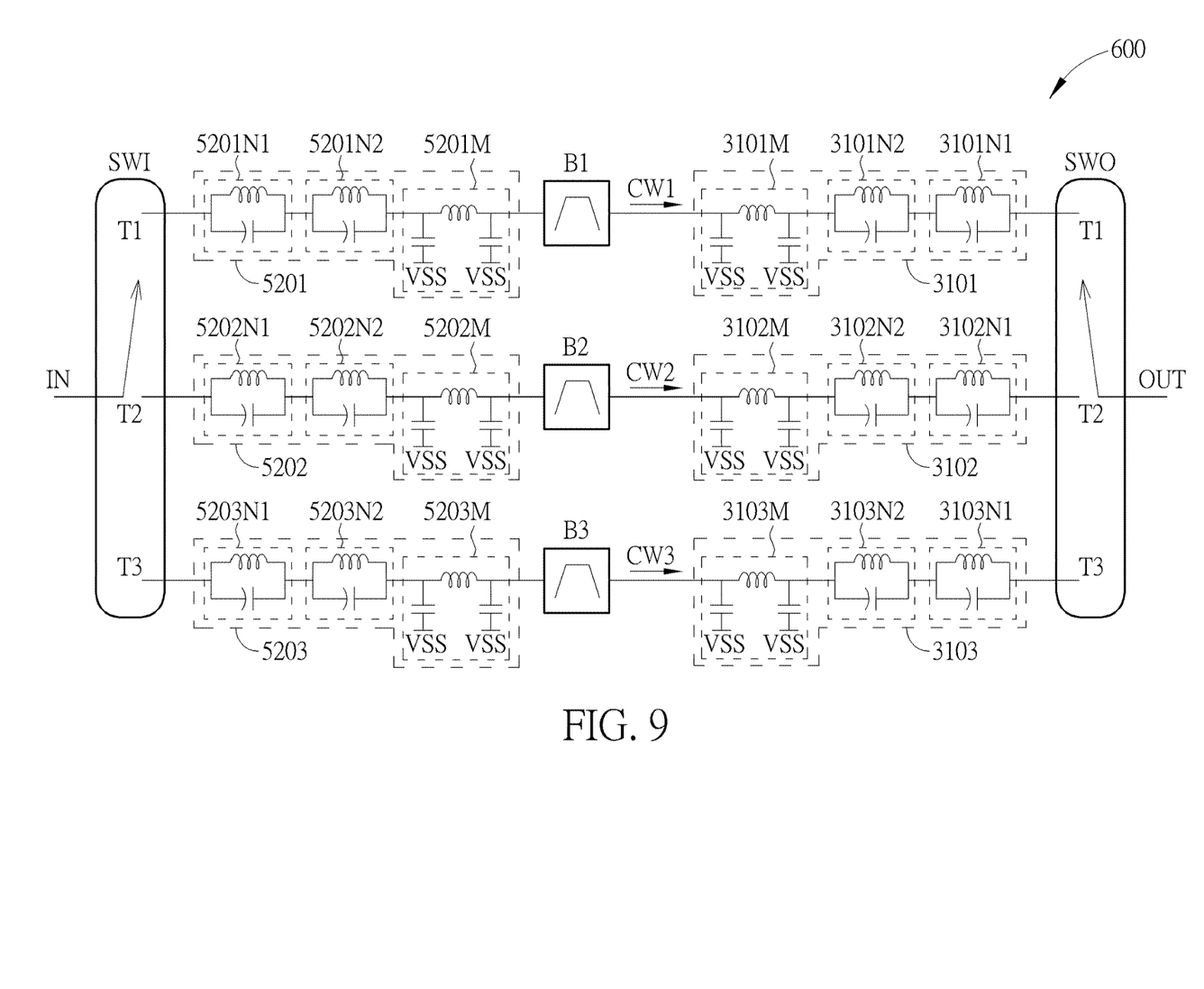

FIG. 9 shows a carrier aggregation circuit 600 according to one embodiment of the present invention. The carrier aggregation circuits 500 and 600 have similar structure and can be operated by similar principles. However, the main difference between these two is in that the carrier aggregation circuit 600 can further include a first switch circuit SWI and a second switch circuit SWO.

In some embodiment of the present invention, the first switch circuit SWI can selectively couple the signal input terminal IN to at least two of the first input transform circuit 5201, the second input transform circuit 5202, and the third input transform circuit 5203. The second switch circuit SWO can selectively couple the signal output terminal OUT to at least two of the first output transform circuit 3101, the second output transform circuit 3102, and the third output transform circuit 3103.

In some other embodiments of the present invention, the first switch circuit SWI can selectively couple the signal input terminal IN to at least one of the first input transform circuit 5201, the second input transform circuit 5202, and the third input transform circuit 5203. The second switch circuit SWO can selectively couple the signal output terminal OUT to at least one of the first output transform circuit 3101, the second output transform circuit 3102, and the third output transform circuit 3103.

In other words, the first switch circuit SWI and the second switch circuit SWO are programmable, so the carrier aggregation circuit 600 can select the aggregation mode by controlling the first switch circuit SWI and the second switch circuit SWO. For example, in Carrier Aggregation (CA) 3DL (B1+B2+B3) mode, if the radio frequency signal $SIG_{RF}$ includes three carrier waves CW1, CW2, and CW3, then the first switch circuit SWI can electrically couple the signal input terminal IN to the first filter B1, the second filter B2, and the third filter B3 by turning on switches T1, T2 and T3 of the first switch circuit SWI at the same time. Also, the second switch circuit SWO can electrically couple the signal output terminal OUT to the first filter B1, the second filter B2, and the third filter B3 by turning on switches T1, T2 and T3 of the second switch circuit SWO at the same time. However, in CA 2DL (B2+B3) mode, if the radio frequency signal $SIG_{RF}$ includes only the two carrier waves CW2 and CW3, then the first switch circuit SWI can electrically couple the signal input terminal IN to the second filter B2 and the third filter B3 by turning on switches T2 and T3 of the first switch circuit SWI at the same time. Also, the second switch circuit SWO can electrically couple the signal output terminal OUT to the second filter B2, and the third filter B3 by turning on switches T2 and T3 of the second switch circuit SWO at the same time. The turning on/off status of switches T1, T2 and T3 are referenced to TABLE I below.

TABLE I

| CA mode | T1 | T2 | T3 |
|---|---|---|---|
| CA 1DL (B1) | ON | OFF | OFF |
| CA 1DL (B2) | OFF | ON | OFF |
| CA 1DL (B3) | OFF | OFF | ON |
| CA 2DL (B1 + B2) | ON | ON | OFF |
| CA 2DL (B1 + B3) | ON | OFF | ON |
| CA 2DL (B2 + B3) | OFF | ON | ON |
| CA 3DL (B1 + B2 + B3) | ON | ON | ON |

Consequently, when designing the carrier aggregation circuit 600, the space for containing the circuits to support the three carrier waves can be preserved during the layout phase, and the elements can be decided according to the practical requirements later. Therefore, the effort for redesigning the circuit layout to meet different requirements can be saved, leaving more flexibility on the circuit design.

In FIG. 9, although the carrier aggregation circuit 600 can control the two switch circuits SWI and SWO to select the supporting mode for providing flexibility to circuit layout designs, the carrier aggregation circuit 600 can also remove the first switch circuit SWI or the second switch circuit SWO and use only one switch circuit according to the system requirements in some embodiments of the present invention.

In summary, the carrier aggregation circuits provided by the embodiments of the present invention can use the input transform circuits and the output transform circuits to reduce the loading effects, allowing the carrier waves with different bands to be processed by the same amplifying path and the same amplifier. Consequently, the number of amplifiers can be reduced, the demand for area and hardware requirements can be reduced, and the design flexibility can be improved. In addition to the switch circuits, the designer can preserve the space for containing circuits to support the desired carrier waves during the layout phase, and decide the proper element later when the practical requirements has been confirmed. Therefore, the effort for redesigning the circuit layout to meet different requirements can be saved, leaving more flexibility on the circuit design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A carrier aggregation circuit comprising:
    a signal input terminal configured to receive a radio frequency signal having a first carrier wave with a first carrier wave frequency and a second carrier wave with a second carrier wave frequency;
    a signal output terminal;
    a first filter coupled between the signal input terminal and the signal output terminal, configured to filter out signals with frequencies other than the first carrier wave frequency, and having an input terminal and an output terminal;
    a first output transform circuit coupled between the output terminal of the first filter and the signal output terminal, and having an output impedance effectively equivalent to an open circuit at the second carrier wave frequency;
    a second filter coupled between the signal input terminal and the signal output terminal, configured to filter out signals with frequencies other than the second carrier wave frequency, and having an input terminal and an output terminal; and
    a second output transform circuit coupled between the output terminal of the second filter and the signal output terminal, and having an output impedance effectively equivalent to an open circuit at the first carrier wave frequency.

2. The carrier aggregation circuit of claim 1 further comprising:
    a first input match transform unit coupled between the signal input terminal and the first filter, and configured to match an input impedance formed by the first filter and the first output transform circuit with the first carrier wave frequency; and
    a second input match transform unit coupled between the signal input terminal and the second filter, and configured to match an input impedance formed by the second filter and the second output transform circuit with the second carrier wave frequency.

3. The carrier aggregation circuit of claim 1, wherein an input impedance of the first output transform circuit matches with the first carrier wave frequency, and an input impedance of the second output transform circuit matches with the second carrier wave frequency.

4. The carrier aggregation circuit of claim 3, wherein the first output transform circuit comprises a first output impedance transform unit configured to adjust the output impedance of the first output transform circuit corresponding to the second carrier wave frequency.

5. The carrier aggregation circuit of claim 4, wherein the first output impedance transform unit is a parallel resonator comprising an inductor and a capacitor coupled in parallel.

6. The carrier aggregation circuit of claim 4, wherein the first output transform circuit further comprises an output match transform unit configured to match the first output transform circuit with the first carrier wave frequency.

7. The carrier aggregation circuit of claim 6, wherein:
the first output impedance transform unit is coupled to the output terminal of the first filter; and
the output match transform unit is coupled between the first output impedance transform unit and the signal output terminal.

8. The carrier aggregation circuit of claim 6, wherein:
the output match transform unit is coupled to the output terminal of the first filter; and
the first output impedance transform unit is coupled between the output match transform unit and the signal output terminal.

9. The carrier aggregation circuit of claim 1, wherein the radio frequency signal further has a third carrier wave with a third carrier wave frequency, and the carrier aggregation circuit further comprises:
a third filter coupled between the signal input terminal and the signal output terminal, configured to filter out signals with frequencies other than the third carrier wave frequency, and having an input terminal and an output terminal; and
a third output transform circuit coupled between the output terminal of the third filter and the signal output terminal, and having an output impedance effectively equivalent to an open circuit at the first carrier wave frequency and at the second carrier wave frequency;
wherein:
the output impedance of the first output transform circuit is effectively equivalent to an open circuit at the third carrier wave frequency; and
the output impedance of the second output transform circuit is effectively equivalent to an open circuit at the third carrier wave frequency.

10. The carrier aggregation circuit of claim 9, wherein an input impedance of the third output transform circuit matches with the third carrier wave frequency.

11. The carrier aggregation circuit of claim 9, further comprising:
a first switch circuit coupled to the signal input terminal, the input terminal of the first filter, the input terminal of the second filter, and the input terminal of the third filter, and configured to selectively couple the signal input terminal with at least one of the first filter, the second filter, and the third filter.

12. The carrier aggregation circuit of claim 9, further comprising:
a second switch circuit coupled to the signal output terminal, the first output transform circuit, the second output transform circuit, and the third output transform circuit, and configured to selectively couple the signal output terminal with at least one of the first output transform circuit, the second output transform circuit, and the third output transform circuit.

13. The carrier aggregation circuit of claim 12, wherein the first output transform circuit comprises:
a first output impedance transform unit configured to adjust the output impedance of the first output transform circuit at the second carrier wave frequency;
a second output impedance transform unit configured to adjust the output impedance of the first output transform circuit at the third carrier wave frequency; and
an output match transform unit configured to match the first output transform circuit with the first carrier wave frequency.

14. The carrier aggregation circuit of claim 13, wherein the first output impedance transform unit is a parallel resonator, and the second output impedance transform unit is a parallel resonator.

15. The carrier aggregation circuit of claim 13, wherein the output match transform unit, the first output impedance transform unit, and the second output impedance transform unit are coupled between the output terminal of the first filter and the signal output terminal.

16. The carrier aggregation circuit of claim 9 further comprising:
a first input transform circuit coupled between the input terminal of the first filter and the signal input terminal, and an input impedance of the first input transform circuit is effectively equivalent to an open circuit at the second carrier wave frequency and at the third carrier wave frequency;
a second input transform circuit coupled between the input terminal of the second filter and the signal input terminal, and an input impedance of the second input transform circuit is effectively equivalent to an open circuit at the first carrier wave frequency and at the third carrier wave frequency; and
a third input transform circuit coupled between the input terminal of the third filter and the signal input terminal, and an input impedance of the third input transform circuit is effectively equivalent to an open circuit at the first carrier wave frequency and at the second carrier wave frequency.

17. The carrier aggregation circuit of claim 16, further comprising:
a first switch circuit coupled to the signal input terminal, the first input transform circuit, the second input transform circuit, and the third input transform circuit, and configured to selectively couple the signal input terminal with at least one of the first input transform circuit, the second input transform circuit, and the third input transform circuit.

18. The carrier aggregation circuit of claim 16, wherein the first input transform circuit comprises:
a first input impedance transform unit configured to adjust the input impedance of the first input transform circuit corresponding to the second carrier wave frequency;
a second input impedance transform unit configured to adjust the input impedance of the first input transform circuit corresponding to the third carrier wave frequency; and
an input match transform unit configured to make the first input transform circuit matched with the first carrier wave frequency.

19. The carrier aggregation circuit of claim 18, wherein:
the input match transform unit, the first input impedance transform unit, and the second input impedance transform unit are coupled between the input terminal of the first filter and the signal input terminal.

20. The carrier aggregation circuit of claim 1, wherein the signal output terminal is coupled to an amplifier.

* * * * *